(12) United States Patent
Morimoto

(10) Patent No.: US 10,418,988 B2
(45) Date of Patent: Sep. 17, 2019

(54) POWER BREAKER APPARATUS

(71) Applicant: YAZAKI CORPORATION, Tokyo (JP)

(72) Inventor: Mitsuaki Morimoto, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 436 days.

(21) Appl. No.: 15/440,828

(22) Filed: Feb. 23, 2017

(65) Prior Publication Data
US 2017/0279443 A1  Sep. 28, 2017

(30) Foreign Application Priority Data
Mar. 28, 2016 (JP) ................. 2016-062966

(51) Int. Cl.
| H01H 31/10 | (2006.01) |
| H01H 33/59 | (2006.01) |
| H01H 47/00 | (2006.01) |
| H01H 85/46 | (2006.01) |
| H03K 17/18 | (2006.01) |
| H03K 17/693 | (2006.01) |
| H03K 17/12 | (2006.01) |

(52) U.S. Cl.
CPC .......... *H03K 17/18* (2013.01); *H03K 17/122* (2013.01); *H03K 17/693* (2013.01); *H03K 2217/0054* (2013.01)

(58) Field of Classification Search
CPC .... H03K 17/122; H03K 17/18; H03K 17/693; H03K 2217/0054

USPC .......................................... 307/115
See application file for complete search history.

(56) References Cited

U.S. PATENT DOCUMENTS

| 7,640,080 B2 | 12/2009 | Nakamura et al. |
| 2007/0253132 A1 | 11/2007 | Nakamura et al. |
| 2016/0064919 A1* | 3/2016 | Oka ................. H02H 3/087 361/91.1 |

FOREIGN PATENT DOCUMENTS

| JP | 2007-295776 A | 11/2007 |
| JP | 2012-70045 A | 4/2012 |

* cited by examiner

*Primary Examiner* — Rexford N Barnie
*Assistant Examiner* — Toan T Vu
(74) *Attorney, Agent, or Firm* — Kenealy Vaidya LLP

(57) ABSTRACT

A power breaker apparatus which performs energization and interception between a power supply and a load, includes a current measuring part which measures a current value flowing in a power line supplying electric power from the power supply to the load, an interception part disposed in the power line and including a plurality of semiconductor switches connected in parallel to each other, a control part comparing the current value measured in the current measuring part with an interception threshold value and, controlling on/off of the plurality of the semiconductor switches according to a comparison result, and a failure detection part which detects a potential on an output side of the interception part so that the control part checks for a failure of the semiconductor switches.

4 Claims, 6 Drawing Sheets

POWER BREAKER APPARATUS

CROSS REFERENCE TO RELATED APPLICATIONS

This application claims priority from Japanese Patent Application No. 2016-062966 filed on Mar. 28, 2016, the entire contents of which are incorporated herein by reference.

BACKGROUND OF THE INVENTION

Field of the Invention

The invention relates to a power breaker apparatus which performs energization and interception between a power source and a load.

Description of Related Art

A vehicle such as an automobile is equipped with a wide variety of loads (electronic equipment). In order to supply and intercept power to the loads, there is arranged a relay between a power supply such as a battery and loads. Recently, as the relay, instead of a conventional mechanical relay, there has been used a semiconductor switch.

For example, the patent document 1 (:JP-A-2007-295776) discloses a load circuit for supplying power to a load. This load circuit includes a battery, a semiconductor switch interposed between the battery and load, and a control circuit for turning on/off the semiconductor switch. The control circuit, when an overcurrent equal to or larger than a specific interception threshold value flows, detects it to turn off the semiconductor switch, thereby shutting off the circuit.

Meanwhile, when the load circuit is applied to an electric path through which a high current flows, there is a possibility that the high current can exceed the maximum current (rated current) which is allowed to flow through a single semiconductor switch. Thus, there is also known a method in which an electric path is equipped with an interception part constituted of a plurality of semiconductor switches connected in parallel to each other, and these semiconductor switches are driven in parallel. However, with this method, even when one of the semiconductor switches fails off, the threshold value current does not change; and thus, an excessive current flows in the remaining semiconductor switches that have not failed, thereby raising a possibility that they can be caused to fail.

In view of this, for example, the patent document 2 (:JP-A-2012-70045) discloses a load drive apparatus. In this load drive apparatus, there are provided a relay circuit group comprising multiple relay circuits connected in parallel to each other, each circuit including a semiconductor switch and a control circuit for controlling on/off of the semiconductor switch, and the relay circuit group is arranged in an electric path for connecting a power source and loads to each other. According to this structure, since, in every relay circuits, a current is detected and is compared with an interception threshold value, the above problem can be solved.

[Patent Document 1] JP-A-2007-295776
[Patent Document 2] JP-A-2012-70045

However, according to a related art, each parallel circuit must be equipped with a current detection device, which leads to higher cost and larger size of the apparatus. Also, since current detection and overcurrent check are performed in every parallel circuits, when switching on/off of the semiconductor switches, there is a possibility that an erroneous interception can be caused by the mismatch of a current flowing in the semiconductor switch. And, when trying to controllably suppress such erroneous interception, there is a possibility that the on/off control can be complicated.

One or more embodiments provide a power breaker apparatus which can suppress occurrence of erroneous interception with a simple structure and, even when one of semiconductor switches connected in parallel to each other fails, the remaining semiconductor switches can supply the minimum necessary power.

According to one or more embodiments, a power breaker apparatus which performs energization and interception between a power supply and a load, includes:

a current measuring part which measures a current value flowing in a power line supplying electric power from the power supply to the load;

an interception part disposed in the power line and including a plurality of semiconductor switches connected in parallel to each other;

a control part comparing the current value measured in the current measuring part with an interception threshold value, and controlling on/off of the plurality of the semiconductor switches according to a comparison result; and a failure detection part which measures a potential on an output side of the interception part and detects a failure so that the control part checks for the failure of the semiconductor switches, wherein the control part changes the interception threshold value from a normal value which is set when the failure is not determined in the semiconductor switches to an exceptional value for the failure of the semiconductor switches, when the failure of the semiconductor switches is determined according to a detection result of the failure detection part.

In the power breaker of one ore more embodiments, the normal value may be set according to energization conditions on the load side when all of the load is operated.

In the power breaker of one ore more embodiments, the interception part may further include a plurality of semiconductor switches connected in a forward direction in which a current flows through the power line from the load side to the power supply.

According to one or more embodiments, occurrence of erroneous interception of semiconductor switches connected in parallel to each other can be suppressed with a simple structure and, even when one of semiconductor switches connected in parallel to each other fails, the minimum necessary power can be supplied to a vehicle without destroying the remaining semiconductor switches.

DETAILED DESCRIPTION

Figure 1:
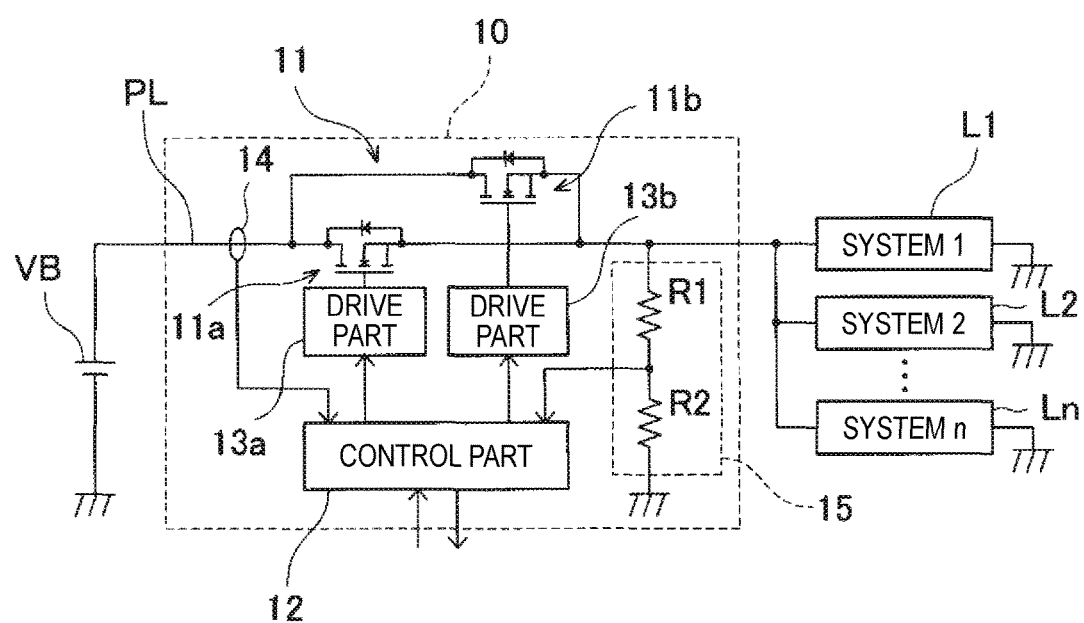
FIG. 1 is a block diagram of the structure of a power breaker apparatus according to an embodiment.

FIG. 1 is a block diagram of the structure of a power breaker apparatus 10 according to an embodiment of the invention. The power breaker apparatus 10 of the embodiment is an apparatus which performs energization and interception between a battery VB serving as a power source and a load and is arranged in a power line PL for connecting the battery VB and load to each other. The power breaker apparatus 10 is mounted, for example, on a vehicle. The vehicle is equipped with various systems L1, L2, . . . Ln as the load which are necessary for the operation thereof. The systems L1~Ln include an inevitable system necessary for the vehicle to run and various systems provided from the viewpoint of safety and convenience.

The power breaker apparatus 10 is mainly constituted of an interception part 11, a control part 12 and a failure detection part 15.

The interception part 11 is disposed in the power line PL, that is, interposed between the battery VB and loads (systems L1~Ln) for energizing and intercepting the power line PL. The interception part 11 is constituted of a pair of semiconductor switches connected in parallel to each other, specifically, a first FET 11a and a second FET 11b. In each of the FETs 11a and 11b, a gate terminal thereof is a control terminal to be connected to drive parts 13a and 13b which are described later. Also, a drain terminal thereof is a terminal which is connected to a connection node on the battery VB side and is connected through the connection node to the battery VB. A source terminal is a terminal which is connected to a connection node on the load side and is connected through the connection node to the loads.

The control part 12 controls turn/off of the paired PETs 11a and 11b.

To turn on the first FET 11a, the control part 12 turns on a first FET drive signal for a first drive part 13a. The first drive part 13a, according to the turn-on of the first FET drive signal, applies a control voltage to the first FET 11a, thereby turning on the first FET 11a. Meanwhile, to turn off the first FET 11a, the control part 12 turns off the first FET drive signal. According to the turn-off of the first FET drive signal, the first drive part 13a does not apply the control voltage to the first FET 11a any longer, thereby turning off the first FET 11a.

Similarly, to turn on the second FET 11b, the control part 12 turns on a second FET drive signal for a second drive part 13b. According to the second FET drive signal, the second drive part 13b applies the control voltage to the second FET 11b thereby turning on the second FET 11b. Meanwhile, to turn off the second FET 11b, the control part 12 turns off the second FET drive signal. According to the turn-off of the second FET drive signal, the second drive part 13b does not apply the control voltage to the second FET 11b any longer, thereby turning off the second FET 11b.

The control part 12 is structured to be able to communicate with a host apparatus including a controller (not shown) for control ling a vehicle. Thus, according to a drive signal (which is hereinafter called [host drive signal]) input from a host device, the control part 12 turns on/off of the paired FETs 11a and 11b. Also, on detecting various abnormal states (such as determination of an overcurrent and failures of FETs 11a and 11b), the control part 12 can output such abnormal states to the host apparatus.

Also, to the control part 12, there is input a detection signal transmitted by a current measuring part 14. The current measuring part 14 is a measuring part to measure a current flowing in the power line PL and, in this embodiment, is disposed in a portion existing nearer to the battery VB side than the interception part 11. According to this structure, since the current measuring part 14 is not provided in the respective parallel circuits of FETs 11a and 11b but is provided in the power line PL constituted of a single electric path, the current may be measured only in one location.

The control part 12, when the paired FETs 11a and 11b are on according to the host drive signal, compares a current measured in the current measuring part 14 (which is hereinafter called. [measured current]) with an interception threshold value. And, based on the comparison result, the control part 12 intercepts the power line PL. Specifically, when the measured current is less than the interception threshold value, the control part 12 continues the on states of the paired FETs 11a and 11b, whereby the energization of the power line PL is continued. Meanwhile, when the measured current is equal to the threshold value or higher, the control part 12 turns off the paired FETs 11a and 11b, thereby intercepting the power line PL.

Further, in the control part 12, there has been input a detection signal from a failure detection part 15. The failure detection part 15 is used to detect the potential on the output side of the interception part 11 in order that the control part 12 can detect the failure of the paired FETs 11a and 11b. In this embodiment, the failure detection part 15 is constituted of a pair of voltage dividing resistances R1 and R2 and is disposed in such location of the power line Pt as exists nearer to the load side than the interception part 11. The failure detection part 15 detects the midpoint. potentials of the paired voltage dividing resistances R1 and R2 and outputs the detected potentials to the control part 12.

Here, the failures of FETs 11a and 11b include an on failure and an off failure. The on failure is a failure in which FETs 11a and 11b are fixed to an on state thereof, whereas the off failure is a failure in which FETs 11a and 11b are fixed to an off state thereof.

According to one of the characteristics of this embodiment, the control part 12, when it finds the failures of FETs 11a and 11b based on the detection results of the failure detection part 15, changes an interception threshold value from a normal value to be set when the failures of FETs 11a and 11b are free from failures to an exceptional value for FET failure.

Figure 2:
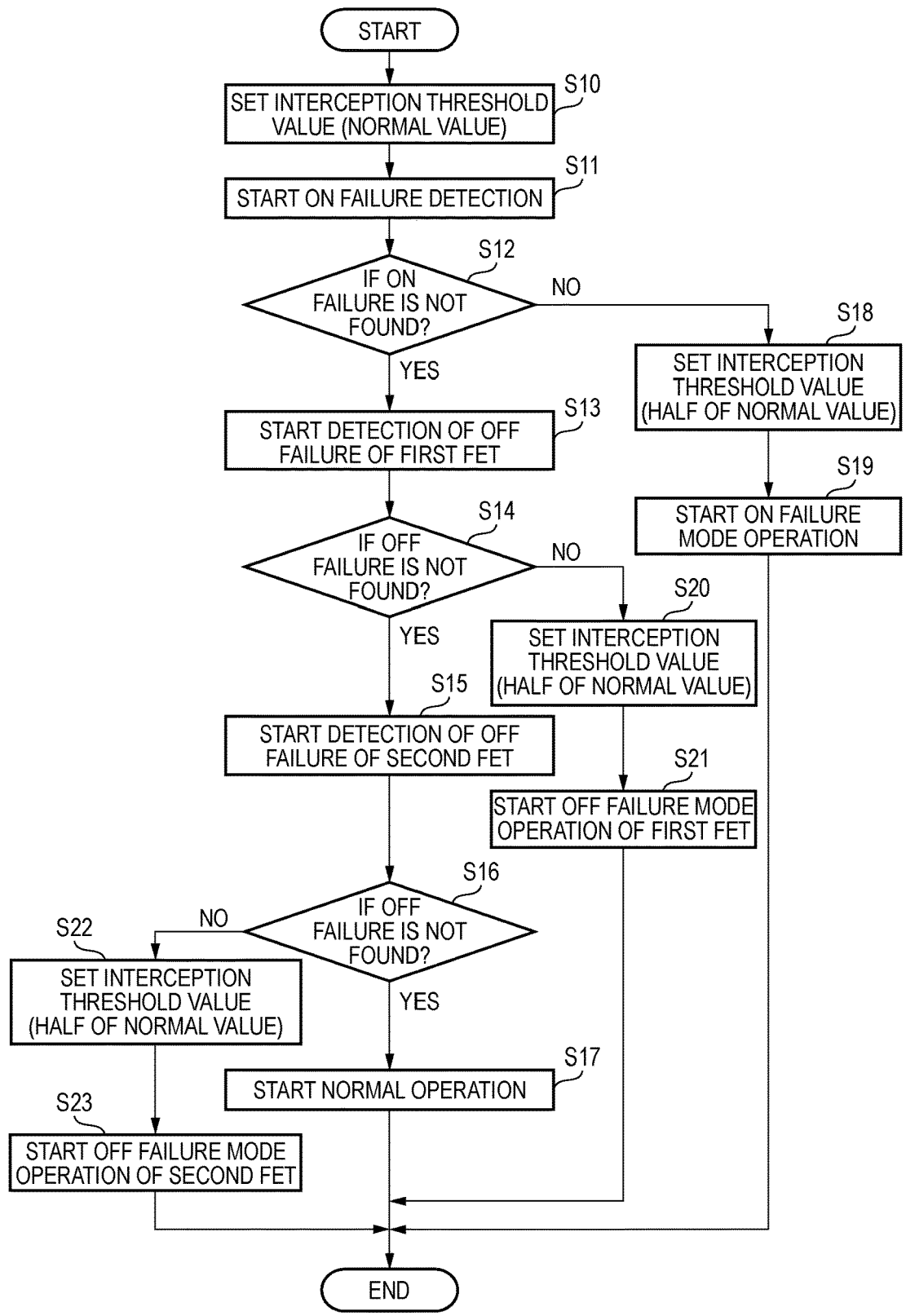
FIG. 2 is a flow chart of the operation of the power breaker apparatus.
Figure 3:
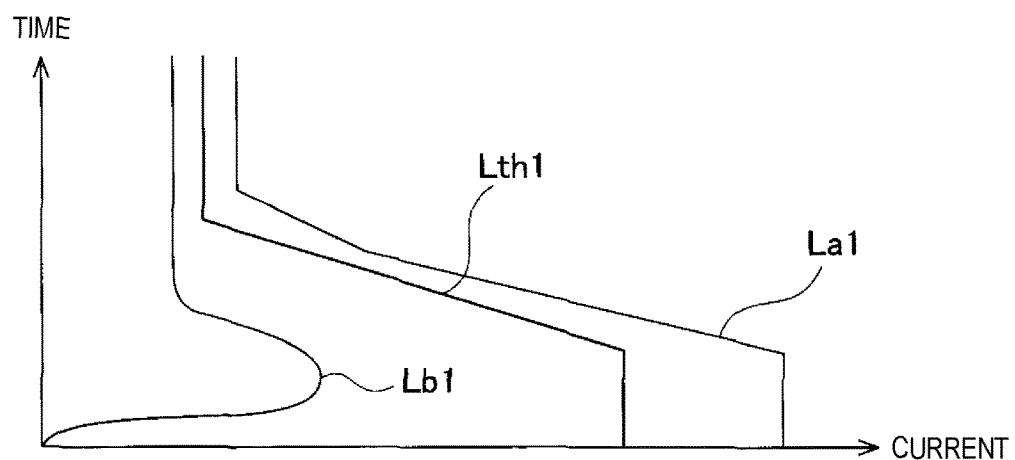
FIG. 3 is an explanatory view of the concept of an interception threshold value.
Figure 4:
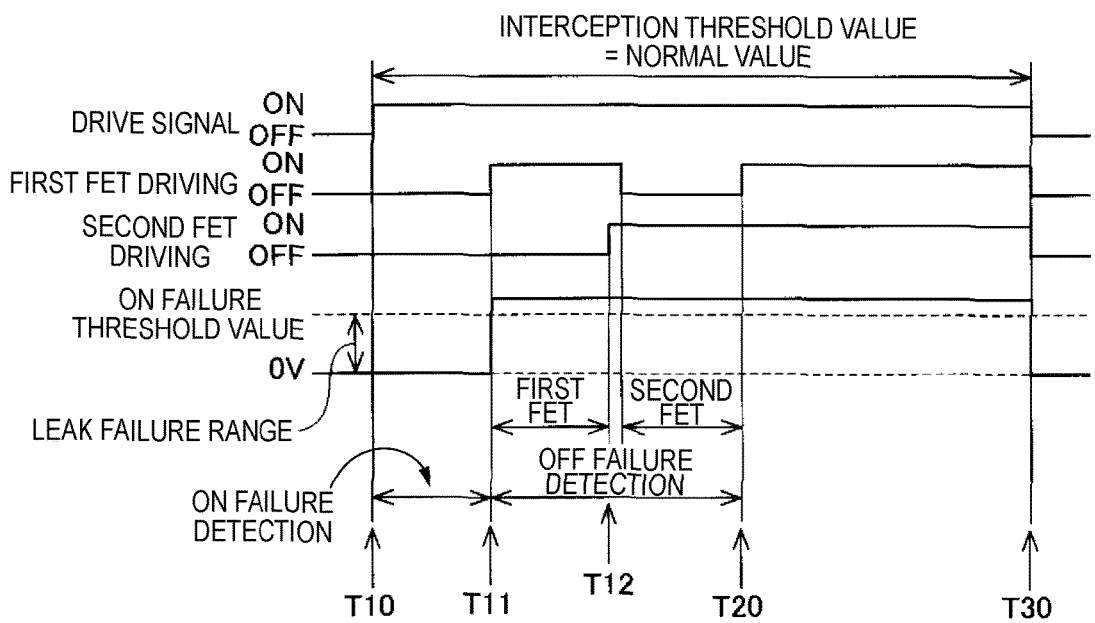
FIG. 4 is a timing chart when FETs are free from failure.
Figure 5A:
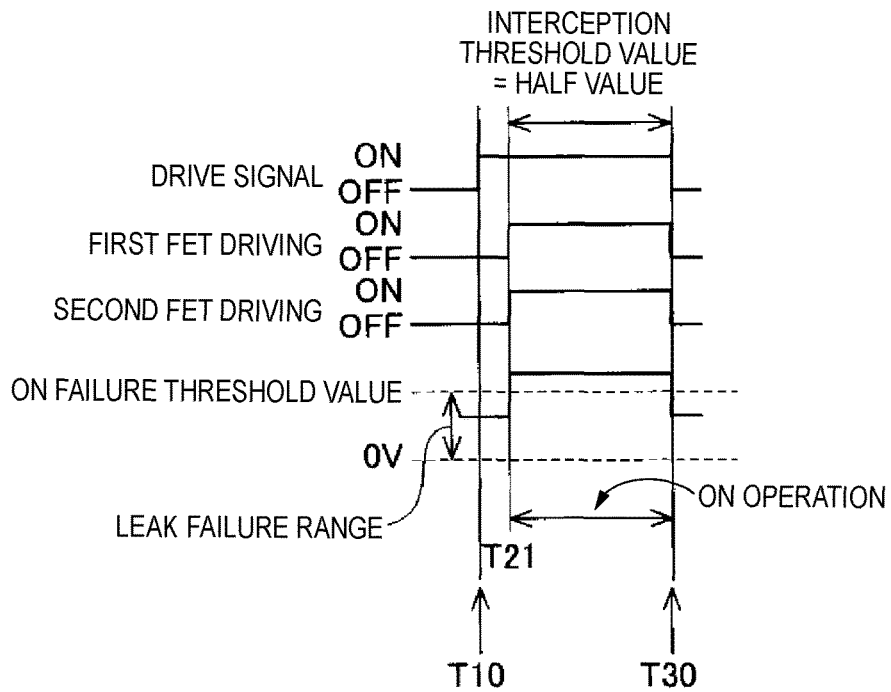
FIGS. 5A and 5B are timing charts when one of FETs fails off.
Figure 5B:
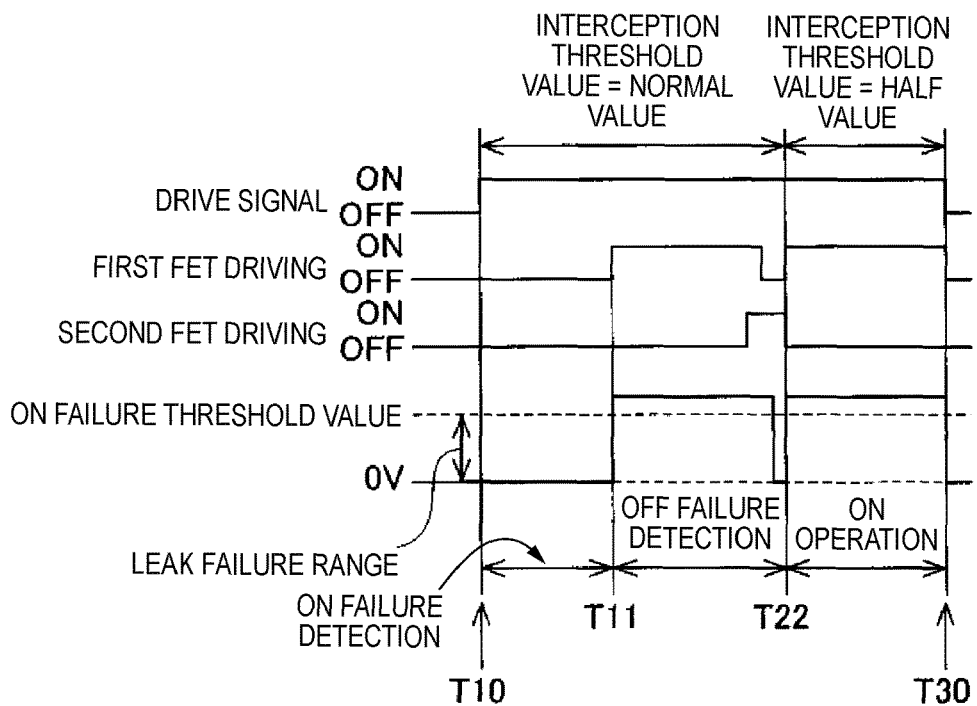

Description is given below of the operation of the power breaker apparatus 10 with reference to FIG. 2. FIG. 2 is a flow chart of the operation of the power breaker apparatus 10. Processing shown in this flow chart is executed by the input of a load drive instruction from the host apparatus, specifically, by the control part 12 with the on detection of a host drive signal as a trigger. Here, FIG. 3 is an explanatory view of the concept of an interception threshold value. Also, FIG. 4 is a timing chart when FETs 11a and 11b are free from failures. Meanwhile, FIGS. 5A and 5B are timing charts when. FETs 11a and 11b fail. Specifically, FIG. 5A is a timing chart when one of FETs 11a and 11b fails on, whereas FIG. 5B is timing chart when the second FET 11b fails off.

Firstly, in Step 10 (S10), the control part 12 sets an interception threshold value. The control part 12, initially, sets the interception threshold value on a normal value Lth1. As shown in FIG. 3, the normal value Lth1 is set on a value higher than the maximum load current (which is hereinafter called [load operation current]) that flows in the power line PL when systems L1~Ln included in the load are all operated. The load operation current Lb1 changes over time, and the normal value Lth1 is also set to provide a value higher than the load operation current Lb1 regardless of such change over time. That is, the normal value Lth1 is set according to the energization condition on the load side.

Further, the normal value Lth1 is set on a value lower than a limiting current that is allowed to flow in the power line PL with the maximum current (rated current) of the paired FETs 11a and 11b taken into consideration, (which is hereinafter called [limiting current La1]). This limiting current La1, similarly to the load operation current Lb1, changes over time. The normal value Lth1 is set on a value lower than the limiting current Lab regardless of such change over time. That is, the normal value Lth1 is set while the load side energization condition and the maximum current condition of the paired FETs 11a and 11b are taken into consideration.

Thus, the normal value Lth1 also changes over time according to the tendency of the two parameters La1 and Lb1. In the control part 12, there is stored information (such as numerical expressions and maps) which specifies the relation between time and normal value Lth1. Thus, the control part 12, when it starts an operation to drive a load, can update dynamically the normal value Lth1 with lapse of the time thereof.

In Step 11 (S11), the control part 12 starts on failure detection (timing T10). Specifically, the control part 12 maintains the off states of the paired FETs 11a and 11b. Thus, since the first and second FET drive signals also remain off, no control voltage is applied to the FETs 11a and 11b from the drive parts 13a and 13b. In this case, unless an on failure occurs in either of the FETs 11a and 11b, no voltage is detected by the failure detection part 15.

In Step 12 (S12), the control part 12 checks whether an on failure exists or not. Specifically, since, when a voltage is detected by the failure detection part 15, any one of the FETs 11a and 11b fails on, the control part 12 determines that an on failure exists. Meanwhile, when no voltage is detected by the failure detection part 15, the control part 12 determines that no on failure exists. For no on failure, the determination is affirmative in Step 12 and thus the processing advances to Step 13 (S13), thereby starting off failure detection. Meanwhile, for an on failure, the determination is negative in Step 12 and thus the processing advances to Step 18 (S18) to be discussed later.

Here, alternatively, the voltage detected by the failure detection part 15 may be A/D converted to a voltage value and this voltage value may be compared with an on failure voltage threshold value used to determine an on failure. This can distinguish between a complete on failure (a failure in which a voltage equal to the on failure voltage threshold value or more is detected) and a failure (a half on failure/leak failure) in which, although the state of the FETs does not reach a complete on failure state, some current flows.

In Step 13, the control part 12 starts off failure detection on the first FET 11a (Timing T11). Specifically, the control part 12 turns on the first FET 11a. In this case, a first FET drive signal (an on signal) is output from the control part 12 to the first drive part 13a. Therefore, unless the first FET 11a is failing off, a voltage is detected by the failure detection part 15. The time necessary for this off failure detection is, for example, dozens of msec. (which is hereinafter called [first off failure detection time]) and, the first FET 11a is turned off after then.

In Step 14 (S14), the control part 12 checks whether the first FET 11a is failing off or not. Specifically, the control part 12, when no voltage is detected by the failure detection part 15, determines that it fails off and, when a voltage is detected by the failure detection part 15, determines that it does not fail off. For no off failure, the determination is affirmative in Step 14 and thus the processing advances to Step 15 (S15). Meanwhile, for an off failure, the determination. is negative and thus the processing advances to Step 20 (S20) to be discussed later.

In Step 15, the control part 12 starts off failure detection on the second. FET 11b (Timing T12). Specifically, the control part 12 turns on the second FET 11b at a timing overlapping with the above-mentioned first off failure detection time. In this case, a second FET drive signal (on signal) is output from the control part 12 to the second drive part 13b. Therefore, unless the second FET 11b fails off, even after lapse of the first of failure detection time, a voltage is detected by the failure detection part 15. The time necessary for this off failure detection is, similarly to the first off failure detection time, for example, several dozens of msec.

In Step 16 (S16), the control part 12 checks whether the second FET 11b is failing off or not. Specifically, unless a voltage is detected by the failure detection part 15 after the elapse of the first off failure detection time, the control part 12 determines that the FET is failing off. Meanwhile, when a voltage is detected by the failure detection part 15 even after elapse of the first off failure detection time, the control part 12 determines that the FET is not failing off. For no off failure, the determination is affirmative in Step and thus the processing advances to Step 17 (S17). Meanwhile, for an off failure, the determination is negative in Step 16 and thus the processing advances to Step 22 (S22) to be discussed later.

In Step 17, the control part 12 starts a load driving operation following the on detection of the host drive signal. When neither an on failure nor an off failure is determined on the FETs 11a and 11b, the control part 12 starts a normal operation (Timing T20). Specifically, the control part 12 turns on the FETs 11a and 11b. That is, the control part 12 switches the first FET 11a from off to on and continues the on state of the second FET 11b.

On starting the normal operation, the control part 12 compares periodically a detection current in the current. measuring part 14 with the normal value Tth1 used as the interception threshold value. And, the control part 12, when. the detection current is equal to or larger than the normal value Tth1, turns off the paired FETs 11a and 11b and, when the detection electric current is lower than the normal value Tth1, continues the on states of the paired FETs 11a and 11b. This normal operation is continued until the host drive signal is switched to off (Timing T30).

Figure 6:
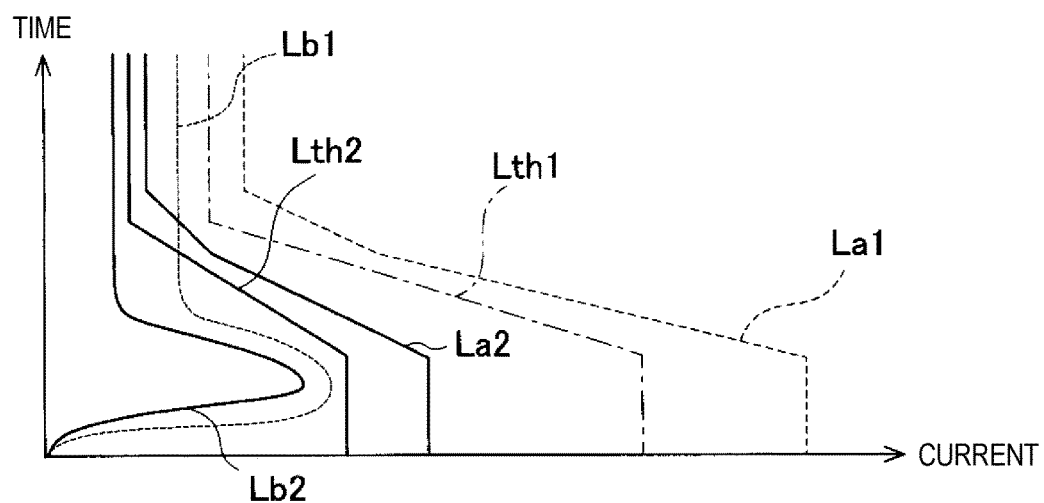
FIG. 6 is an explanatory view of the concept of an interception threshold value.

On the other hand, when any one the paired FETs 11a and 11b is failing off, in Step 18, the control part 12 sets the interception threshold value. In this step, the interception threshold value is set on an exceptional value for FET failure, specifically, a value Lth2 (which is hereinafter called simply [half value Lth2]) half of the normal value Lth1 (see FIG. 6). This half value Lth2 is set between a current (which is hereinafter called [necessary current]) which flows in the power line PL when, of the systems L1~Ln included in the load, only the system of high priority is selectively operated and the maximum current La2 involved with the other of the FETs 11a and 11b (a single FET 11a or 11b). Here, the system of high priority corresponds to an inevitable system necessary for a vehicle to run. Therefore, even when the inevitable system necessary for a vehicle to run is operated according to the half value Tth2, the interception of the power line PL, is not performed and, before the current reaches the maximum current La2 of the other of the FETs 11a and 11b, the interception of the power line PL is performed.

Here, the maximum current La2 and necessary current Lb2 respectively change over time. Therefore, the half value Lth2 also changes over time according to the changes of the two parameters La2 and Lb2. In the control part 12, there is stored information (such as numerical expressions or maps) which specifies the relation between the time and half value Lth2. Therefore, on starting a load driving operation, the control part 12 can update dynamically the half value Lth2 with lapse of the time thereof.

In Step 19 (S19), the control part 12 starts a load driving operation following the on detection of the host drive signal. When it is determined that any one of the FETs 11a and 11b fails on, the control part 12 starts the operation in an on failure mode (Timing T21). Specifically, the control part 12 turns on the first and second FETs 11a and 11b. That is, the control part 12 switches the first and second FETs 11a and 11b from off to on respectively.

When the operation starts in the on failure mode, the control part 12 compares periodically the measured current in the electric current measuring part 14 with the half value Tth2 used as the interception threshold value. The control part 12, when the measured current is equal to or larger than the half value Tth2, turns off the paired first and second FETs 11a and 11b and, when the measured current is lower than the half value Tth2, continues the on states of the paired first and second FETs 11a and 11b. This operation is continued until the host drive signal is switched to off (Timing T30).

Here, the control part 12, when it determines an on failure, or in the case of an excessive current (when the measured current is equal to or larger than the half value Tth2), may output an abnormal signal to the host apparatus (this applies similarly to an off failure which is discussed later).

Also, when the first FET 11a is failing off, in Step 20, the control part 12 sets an interception threshold value. In this step, the interception threshold value is set on the half value Lth2 used as an exceptional value for FET failure.

In Step 21 (S21), the control part 12 starts a load drive driving operation following the on detection of the host drive signal. When an off failure is determined in the first FET 11a, the control part 12 starts the operation in a first FET off failure mode. Specifically, the control part 12 turns off the first FET 11a and turns on the second FET 11b.

When the operation starts in the first FET off failure mode, the control part 12 compares periodically the measured current in the current measuring part 14 with the half value Tth2 used as the interception threshold value. And, the control part 12, when the measured current is equal to or larger than the half value Tth2, turns off the second FET 11b and, when the measured current is lower than the half value Tth2, continues the on state of the second FET 11b. This operation is continued until the host drive signal is switched to off.

On the other hand, when the second FET 11b is failing off, in Step 22, the control part 12 sets an interception threshold value. In the setting of this step, the interception threshold value is set on the half value Lth2 used as an exceptional value to FET failure.

In Step 23 (S23), the control part 12 starts a load driving operation following the on detection of the host drive signal. When an off failure is determined in the second FET 11b, the control part 12 starts the operation in a second FET off failure mode. Specifically, the control part 12 switches the first FET 11a from off to on and turns off the second FET 11b.

When the operation starts in the second FET failure mode, the control part 12 compares periodically the measured current in the current measuring part 14 with the half value Tth2 used as the interception threshold value. And, the control part 12, when the detection electric current is equal to or higher than the half value Tth2, turns off the first FET 11a and, when the measured current is lower than the half value Tth2, continues the on state of the first FET 11a. This operation is continued until the host drive signal is switched to off.

Thus, in this embodiment, the power breaker apparatus 10 is used to perform energization and interception between the battery VB and loads. This power breaker apparatus 10 comprises the current measuring part 14 for measuring a current value flowing in the power line PL, the interception part 11 disposed in the power line PL and including the paired FETs 11a and 11b connected in parallel to each other, the control part 12 which compares the current value measured in the current measuring part 14 with the interception threshold value and, based on the comparison result, controls on/off of the paired FETs 11a and 11b, and the failure detection part 15 which, in order to enable the control part 12 to detect the failure of the FETs 11a and 11b, detects the potential on the output side of the interception part 11. And, the control part 12, when it determines based on the detection result of the failure detection part 15 that the FETs 11a and 11b fail, changes the interception threshold value from the normal value Tth1 to be set when no failure is determined in the FETs 11a and 11b to the exceptional value for FET failure.

According to this structure, the current in the power line PL may only be detected and thus currents need not be detected in every individual FETs 11a and 11b, thereby enabling suppression of cost increase and upsizing of the structure. Also, since the determination of excessive currents in every individual FETs 11a and 11b is avoided, it is possible to suppress, for example, occurrence of erroneous interception in which the FETs 11a and 11b are caused to turn off individually due to mismatch between currents respectively flowing in the FETs 11a and 11b.

Also, when the failures of the FETs 11a and 11b are determined, the interception threshold value is changed from the normal value Tth1 to be set for determination of no failure of the FETs 11a and 11b to the exceptional value for FET failure. By controlling the interception of the power line PL according to this exceptional value, it is possible to suppress occurrence of, for example, a phenomenon in which excessive currents flow into the failure-free FETs 11a and 11b to thereby bring them into failure.

Thus, according to the power breaker apparatus 10 of this embodiment, using a simple structure, occurrence of erroneous interception of semiconductor switches connected in parallel to each other can be suppressed and, even when one of the parallel-connected semiconductor switches fails, minimum necessary power can be supplied to a vehicle without breaking the remaining semiconductor switches.

Also, in this embodiment, the control part 12, on receiving an host drive signal (an on signal), that is, a load drive instruction, performs first the failure detection of the paired FETs 11a and 11b and, after then, in order to drive the loads, controls the paired FETs 11a and 11b in a mode according to the result of the failure detection.

According to this structure, prior to driving of the loads, the failure detection of the paired FETs 11a and 11b is performed. Therefore, when driving the loads, the FETs 11a and 11b can be controlled in a proper mode according to the result of the failure detection. Also, since the interception threshold value is applied according to the result of the failure detection, driving of loads can be started in a state where a proper interception threshold value is set.

Also, in this embodiment, the control part 12 performs, as failure detection, an on failure and an off failure detection to be performed after the on failure detection. Here, the on failure detection is a processing which, with the paired FETs 11a and 11b remaining off, checks, from the potential detected in the failure detection part 15, the paired FETs 11a and 11b for their on failures. Meanwhile, the off failure detection is a processing which switches the paired FETs 11a and 11b alternatively on and checks the paired FETs 11a and 11b for their off failures from the potential detected in the failure detection part 15.

According to this structure, the failures of the FETs 11a and 11b can be detected properly.

Figure 7:
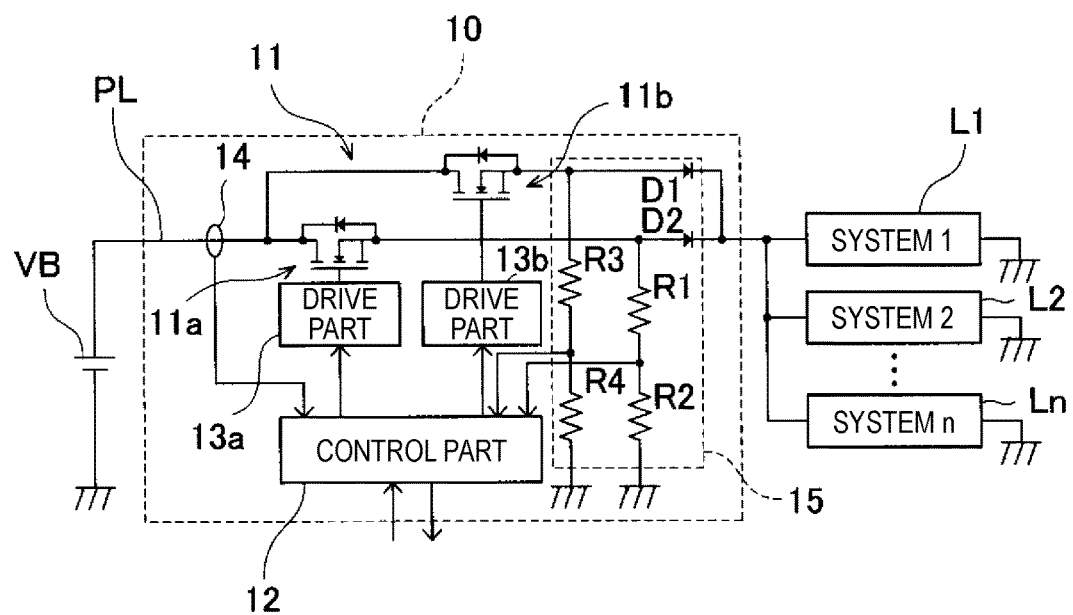
FIG. 7 is a block diagram of another structure of the power breaker apparatus of the embodiment.

Here, in the above-mentioned embodiment, the potential on the output side of the interception part 11, specifically, the potential in the power line PL is detected. Thus, in the case of the on failure, it is unclear which one of the FETs 11a and 11b is failing on. Thus, as shown in FIG. 7, the failure detection part 15 may also be constituted of a pair of voltage dividing resistances R1 and R2 arranged on the output side of the first FET 11a and a pair of voltage dividing resistances R3 and R4 arranged on the output side of the second FET 11b. Thus, the on failures of the paired FETs 11a and 11b can be determined individually. Here, in this structure, to an electrical path corresponding to the FETs 11a and 11b, there are added diodes D1 and D2 downstream of the connecting points of the respective voltage dividing resistances R1~R4.

Also, in this embodiment, the normal value Tth1 of the interception threshold value set according to an energization condition on the load side when all loads are operated.

According to this structure, by taking the energization condition into consideration, changes over time of a current flowing in the loads can be reflected on the normal value Tth1. This can suppress occurrence of erroneous interception.

Also, in this embodiment, the exceptional value for FET failure is set for a value (half value) Tth2 half of the normal value Tth1 to be set when the failures of the FETs 11a and 11b are not determined.

According to this structure, even while the loads are being driven by the failure-free FETs 11a and 11b, it is possible to suppress occurrence of a trouble that excessive currents flow to the FETs 11a and 11b to thereby bring them into failure. Also, since the exceptional value does not become extremely lower than the normal value Tth1, the minimum necessary load can be driven without making the determination that an excessive current flows therein.

Here, in this embodiment, the exceptional value for FET failure is set for a value (half value) Tth2 one half of the normal value Tth1. However, this exceptional value may only be set lower than the normal value Tth1. More preferably, the exceptional value may be set according to the load side energization condition when only the load of high priority is selectively operated (condition showing changes over time of a current to be supplied to this load) and the maximum current condition for the current allowed to flow to one of the FETs 11a and 11b (condition showing changes overtime of the maximum current).

According to this structure, even while the loads are being driven by a single failure-free FET 11a or 11b, it is possible to suppress occurrence of a trouble that an excessive current flows to the FET 11a or 11b to thereby bring it into failure. Also, by selectively operating only the load of high priority, that is, the inevitable load necessary for running of a vehicle, the vehicle is allowed to run without making the determination that an excessive current flows in the FET. This can suppress occurrence of a trouble that the vehicle is caused to stop suddenly on the road.

Figure 8:
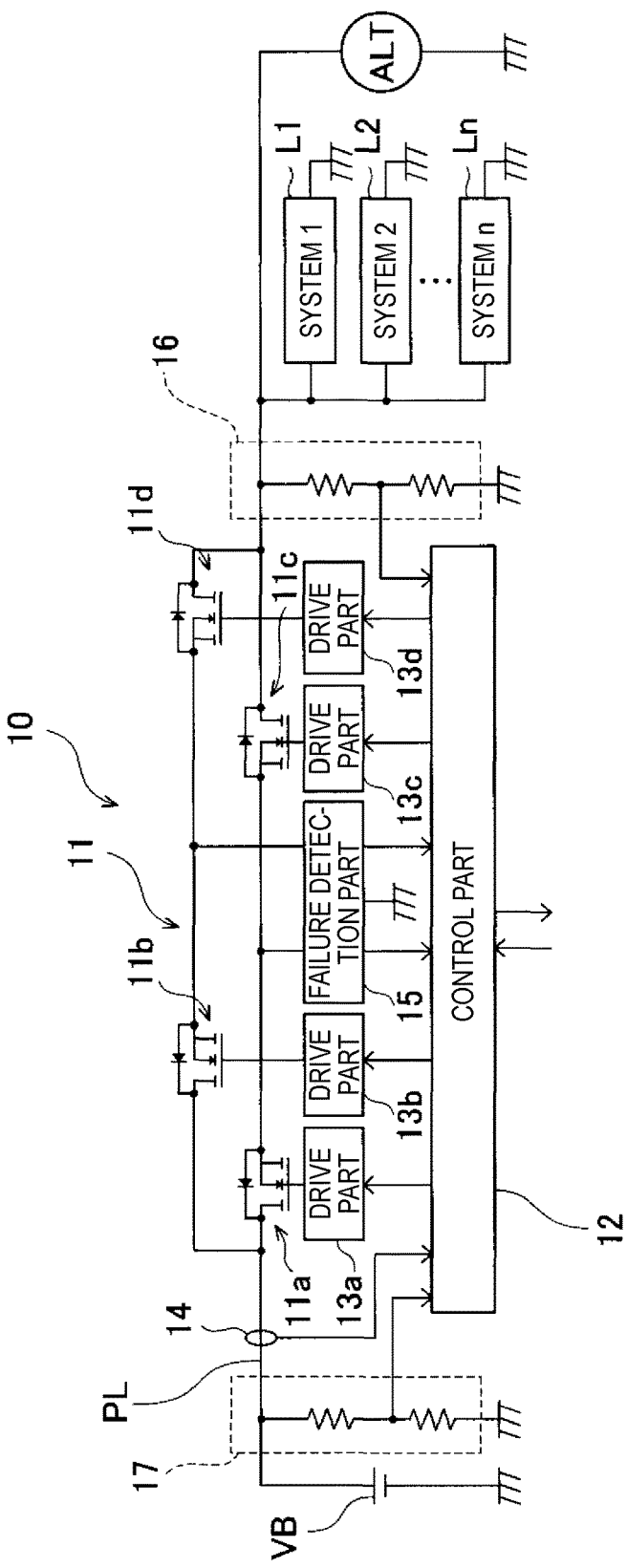
FIG. 8 is a block diagram of still another structure of the power breaker apparatus of the embodiment.

Here, in the above embodiment, on the premise that power is supplied from the battery VB to the loads (systems L1~L7) the paired FETs 11a and 11b are arranged in a direction providing a forward direction where a current flows from the battery VB to the loads. However, in an electric car or a hybrid car, as shown in FIG. 8, in some cases, a generating device such as an alternator is arranged on the load side and power is supplied from the load side to the battery VB.

In this case, the interception part 11, preferably, may further include a pair of FETs 11c and 11d connected to each other in a direction providing a forward direction when a current flows from the load side to the battery VB through the power line PL. Also, correspondingly to the added paired FETs 11c and 11d, there are added drive parts 13c and 13d for driving them. Here, in the power line PL, there are arranged a battery voltage detection part 17 for detecting the voltage of the battery VB and an alternator voltage detection part 18 for detecting the output voltage of the alternator ALT.

Thus, even when power is supplied from the load side to the battery VB, interception control can be performed similarly.

Although description has been given heretofore of the power breaker apparatus of this embodiment, the invention is not limited to this embodiment but various changes are possible within the scope of the invention.

For example, in the above embodiment, parallel circuits corresponding to a pair of FETs are used to share a current flowing in the power line. However, three or more FETs may also be used so long as they are connected parallel to each other to thereby share the current with each other.

Also, in this embodiment, as the semiconductor switch, there is shown the FET. However, this is not limitative but a transistor or an IGBT may also be used.

DESCRIPTION OF REFERENCE NUMERALS AND SIGNS

10: power breaker apparatus
11: interception part
11a: first FET
11b: second FET
11c: third FET
11d: fourth FET
12: control part
13a: drive part
13b: drive part
14: current measuring part
15: failure detection part
Pt: power line
VB: battery

What is claimed is:

1. A power breaker apparatus which performs energization and interception between a power supply and a load, comprising:
   a current measuring part which measures a current value flowing in a power line supplying electric power from the power supply to the load;
   an interception part disposed in the power line and including a plurality of semiconductor switches connected in parallel to each other;
   a control part comparing the current value measured in the current measuring part with an interception threshold value, and controlling on/off of the plurality of the semiconductor switches according to a comparison result; and a failure detection part which measures a potential on an output side of the interception part and detects a failure so that the control part checks for the failure of the semiconductor switches, wherein the control part changes the interception threshold value from a normal value which is set when the failure is not determined in the semiconductor switches to an exceptional value for the failure of the semiconductor switches, when the failure of the semiconductor switches is determined according to a detection result of the failure detection part.

2. The power breaker apparatus according to claim 1, wherein the normal value is set according to energization conditions on the load side when all of the load is operated.

3. The power breaker apparatus according to claim 1, wherein the interception part further includes a plurality of semiconductor switches connected in a forward direction in which a current flows through the power line from the load side to the power supply.

4. The power breaker apparatus according to claim 2, wherein the interception part further includes a plurality of semiconductor switches connected in a forward direction in which a current flows through the power line from the load side to the power supply.

* * * * *